United States Patent [19]
Ang et al.
[11] 3,769,619
[45] Oct. 30, 1973

[54] STRIPLINE ASSEMBLY FOR USE IN MICROWAVE CIRCUITS AND METHOD OF FABRICATING SAME

[75] Inventors: Choh-Yi Ang; George J. Mills, both of Santa Ana, Calif.

[73] Assignee: Northrop Corporation, Los Angeles, Calif.

[22] Filed: Apr. 20, 1972

[21] Appl. No.: 245,876

[52] U.S. Cl. .............................. 333/84 M, 29/471.1
[51] Int. Cl. ......................... H01p 3/08, B23k 31/02
[58] Field of Search ........................... 333/84 M, 30; 317/234 M; 29/471.1, 502, 504

[56] References Cited

UNITED STATES PATENTS

| | | | |
|---|---|---|---|
| 3,519,962 | 7/1970 | Lind | 333/84 M |
| 3,620,692 | 1/1971 | Franklin et al. | 317/234 M |
| 3,551,997 | 1/1971 | Etter | 317/234 M |
| 3,649,945 | 3/1972 | Waits | 317/234 M |
| 3,581,161 | 5/1971 | Cunningham | 317/234 M |

*Primary Examiner*—Rudolph V. Rolinec
*Assistant Examiner*—Hugh D. Jaeger
*Attorney*—Edward A. Sokolski et al.

[57] ABSTRACT

A stripline assembly suitable for use as a delay line in a microwave amplifier tube or the like is formed by bonding a dielectric isolator at one face thereof to a conductive stripline of a highly conductive metal such as copper, and at the opposite face to a highly conductive support base which also may be of copper. The dielectric material which may be of a high thermal conductivity ceramic is bonded to the aforementioned metallic components by depositing a thin metallic layer of material such as molybdenum onto each of the ceramic faces to achieve a good metal-ceramic bond. A second metallic layer which may be of copper is then deposited onto the molybdenum to provide a medium which can be brazed to the copper stripline and the support base, as the case may be.

5 Claims, 6 Drawing Figures

STRIPLINE ASSEMBLY FOR USE IN MICROWAVE CIRCUITS AND METHOD OF FABRICATING SAME

This invention relates to stripline assemblies for use in microwave circuits and more particularly to such a stripline assembly which is joined to and electrically isolated from a conductive support base by a dielectric isolator member.

Stripline assemblies are used in microwave circuits such as microwave amplifier tubes, for providing delay lines in the implementation of the operation of the circuitry involved. In the fabrication of such stripline assemblies a ceramic substrate of a material such as beryllium oxide is generally used to support the stripline on a metallic support base in electrical isolation therefrom. This ceramic substrate must be properly bonded to the stripline and the support base for optimum thermal dissipation, and at the same time must have electrical characteristics which contribute minimum losses at the microwave frequencies of interest. The prior art technique for achieving this end result involves the metallization of the opposite faces of beryllium oxide bars with a molybdenum-manganese alloy, which is then nickel and gold plated. The metallized bars are then brazed to the stripline at one face and to the support base at the other.

It has been found that such prior art stripline assemblies have relatively high losses which lead to overall stripline efficiencies of 50 percent and microwave tube efficiencies of only 25 percent. It is belived that this is due to the fact that the molybdenum-manganese apparently reacts (mixed oxides formation) with the beryllium oxide resulting in a relatively thick layer of an interlocking diffusion interface. While this interface provides good mechanical adherence, it contributes to a high thermal barrier and high electrical resistivity which results in the high aforementioned electrical losses.

The technique and device of this invention overcomes the aforementioned shortcomings of the prior art by providing a metallization system having markedly improved efficiency over the prior art, while at the same time having bonding characteristics at least as good as those of the prior art. In achieving this end result, the formation of undesirable intermetallic compounds is avoided and the requirement of solid solubility minimized.

It is therefore an object of this invention to provide a microwave stripline assembly having improved efficiency.

It is another object of this invention to provide a technique for fabricating an improved microwave stripline assembly.

It is a further object of this invention to enable the attachment of a microwave strip assembly to a support base with good mechanical adherence and with minimum electrical losses in the stripline.

Other objects of this invention will become apparent as the description proceeds in connection with the accompanying drawings, of which:

Briefly described, the technique and device of the invention are as follows: A dielectric bar, which may be of a high thermal conductivity ceramic such as beryllium oxide, is metallized on opposite faces thereof by first depositing a layer of molybdenum on each of said opposite surfaces, as by RF sputtering, and then depositing a highly conductive layer of a material such as copper, again by a technique such as sputtering. In one embodiment, the copper layers are then bonded respectively to the stripline and the metal base over which the stripline is to be supported, this end result being achieved by brazing in hydrogen atmosphere in the 900°C – 1,020°C temperature range. In other embodiments of the invention, a copper-silver or copper-gold eutectic is formed by depositing a thin layer of silver or gold over the copper metallization layer on the ceramic bar, this permitting a lower brazing temperature in bonding to the stripline and the support base.

Figure 1:
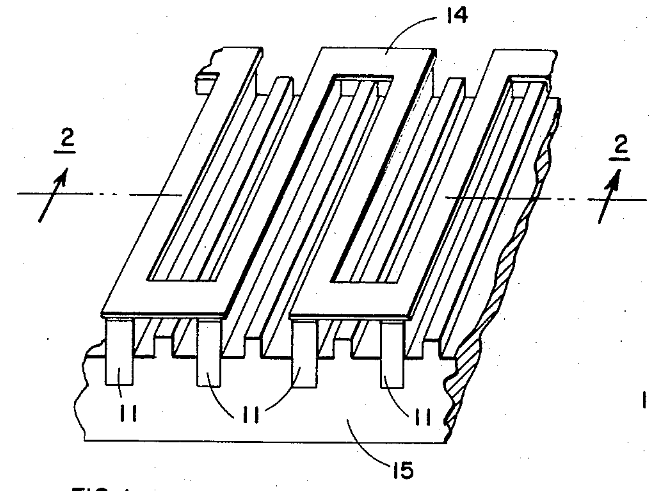
FIG. 1 is a perspective view illustrating a typical stripline assembly in which the invention may be incorporated.
Figure 3:
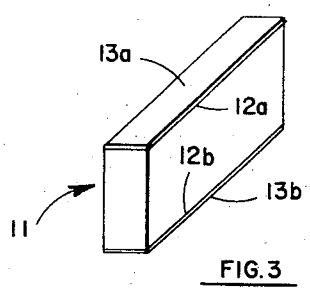
FIG. 3 is a perspective view illustrating the metallization of the opposite faces of the dielectric isolator utilized in the invention.
Figure 2:
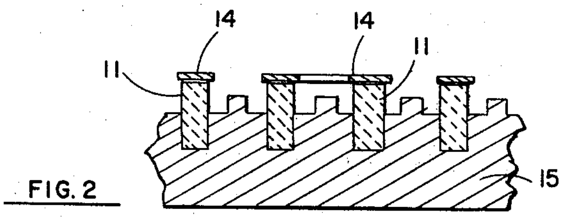
FIG. 2 is a cross sectional view taken along the plane indicated by 2—2 in FIG. 1.

Referring now to FIGS. 1–3, a typical stripline assembly in which the technique and structure of the invention may be incorporated is illustrated. Dielectric isolator member 11, which is of a high thermal conductivity ceramic such as beryllium oxide, aluminum oxide, boron nitride or silicon oxide, has first thin metal layers **12*a* and 12*b* which may be of molybdenum, deposited on each of opposite faces thereof, and second metallic layers 13*a* and 13*b*, which may be of copper, deposited over the molybdenum. One of the copper surfaces 13*a* is bonded to stripline 14 as by brazing, while the other metallized surface 13*b* is bonded also by brazing to support base 15**, which also is of a highly conductive metal such as copper.

Figure 4:
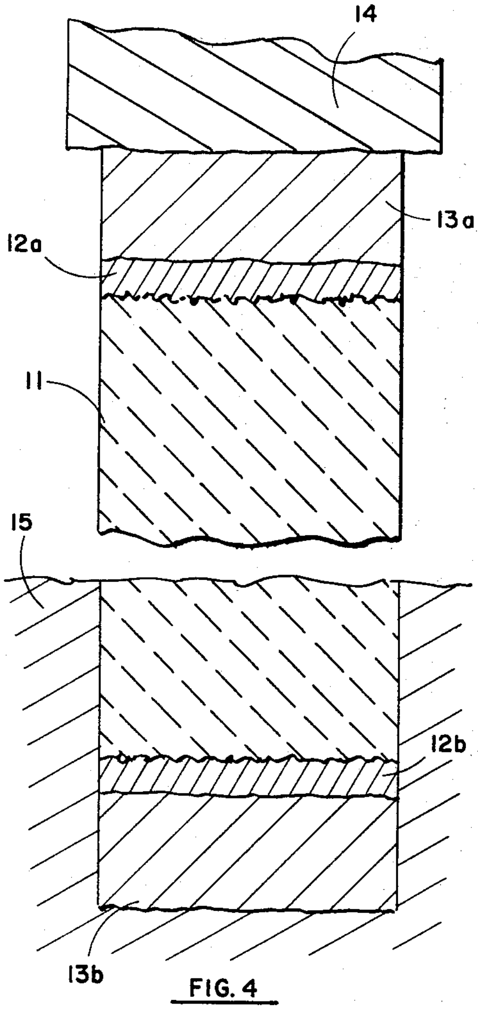
FIG. 4 is a schematic view illustrating one embodiment of the device and technique of the invention.

Referring now to FIG. 4, the structural details of the dielectric isolator and its metallized layers for joining it to the stripline and the support base are illustrated. Isolator bar 11 is preferably of a ceramic material, such as beryllium oxide. Bonded to each of the opposite faces of bar 11 are thin films **12*a* and 12*b* of molybdenum, which typically would have a thickness of 3,000 – 5,000 Angstrom units. Deposited over layers 12*a* and 12*b* are conductive layers 13*a* and 13*b* respectively of copper, which typically have a thickness of 5 – 10 micrometers. Copper layer 13*a* is then brazed to copper stripline 14 and copper layer 13*b* brazed to support base 15**.

Figure 5:
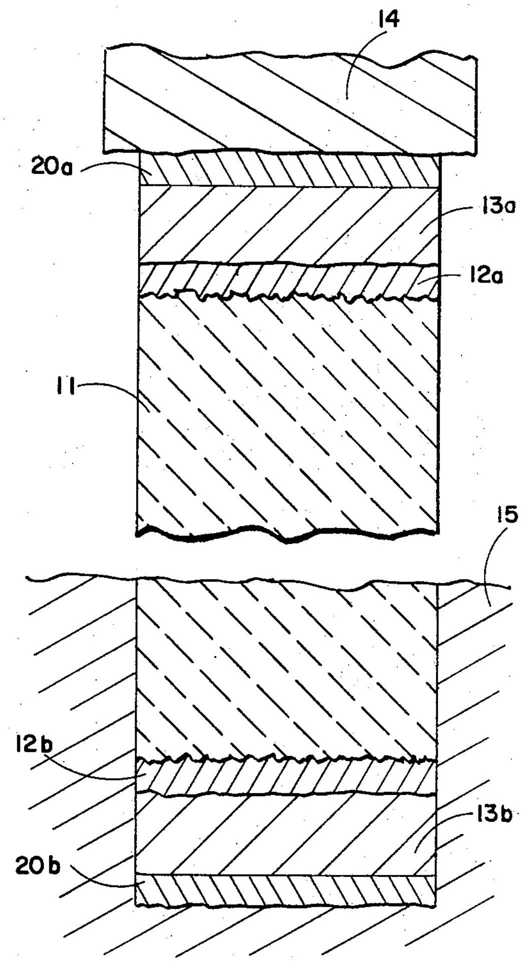
FIG. 5 is a schematic view illustrating a second embodiment of the device and technique of the invention.

Referring now to FIG. 5, a second embodiment of the invention is shown, this embodiment differeing from the first only in that a metal eutectic layer is added to facilitate brazing to the copper stripline and support base. As shown in the FIGURE, thin metallic layers **20*a* and 20*b* are deposited on copper layers 13*a* and 13*b* respectively. Layers 20*a* and 20*b* may be of silver or gold of a thickness of less than 1 micro-meter, this thickness being based on skin depth considerations at the microwave frequencies of interest. The silver or gold layers 20*a*and 20*b*** are sputtered on top of the copper layers to form lower melting point copper-gold or copper-silver alloys so as to permit the lowering of the brazing temperature for bonding to the stripline and the support base. Typically, the brazing temperature may be lowered from 1,020°C to 800°C for the copper-silver alloy and to 900°C for the copper-gold alloy.

The following illustrative examples of the technique of the invention are presented.

EXAMPLE I

A sintered beryllium oxide substrate 2 inches × 2 inches × 0.020 inches was cleaned and loaded into a sputtering chamber which had been evacuated to $10^{-8}$ torr. Dry pure argon gas was then introduced into the chamber to bring the chamber pressure to $2 \times 10^{-2}$ torr. Using a molybdenum target, RF sputtering was carried out at an RF power of 1 kilowatt for 15 minutes, using a distance of 6 inches between the molybdenum target and the substrates to deposit molybdenum films of 3,000 Angstrom units thickness on the opposite faces of the beryllium oxide plates. A copper film 5.7 micrometers thick was then sputtered onto each of the molybdenum films. The metallized beryllium oxide bar was then brazed at one face to a copper stripline and at the opposite face to a support base as described in connection with FIGS 4 and 5.

EXAMPLE II

The process as described in Example I was carried out, except prior to the brazing of the metallized beryllium oxide plates to the stripline and the support base, a thin layer of silver (20*a* and 20*b* as shown in FIG 5) was deposited, preferably by sputtering, over each of the copper layers on the opposite faces to a thickness of about 3,000 Angstrom units. A diffusion treatment at 650°–700°C for 15 minutes promotes the formation of a copper-silver eutectic to facilitate brazing.

EXAMPLE III

The same steps as in Example I were followed, except that prior to the brazing of the metallized surfaces to the stripline and the support base, a thin layer (20*a* and 20*b*, FIG 5) of gold (about 3,000 Angstrom units thickness) was sputtered over both copper surfaces on the opposite faces, followed by a thermal treatment at 800°–850°C for 30 minutes to form a eutectic copper-gold alloy for facilitating brazing to the copper stripline and the support base.

Figure 6:
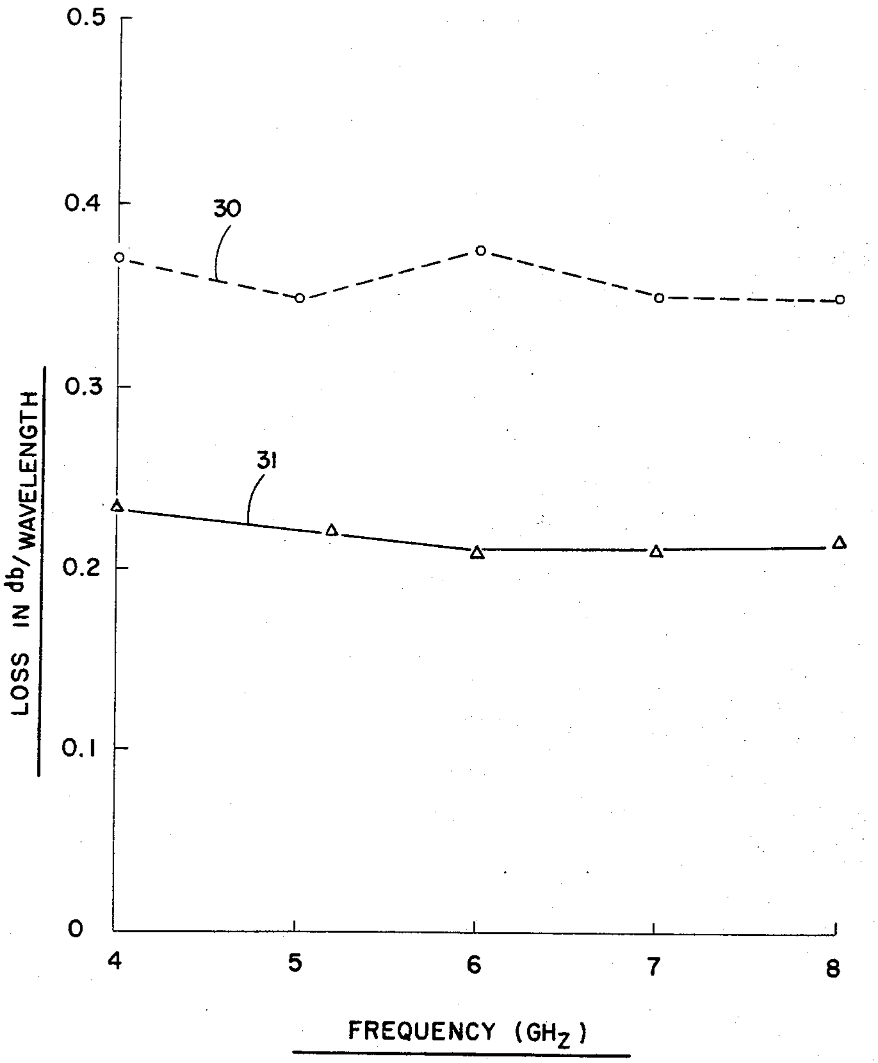
FIG. 6 is a graph illustrating the improvement in efficiency achieved in the device of the invention.

Referring now to FIG 6, the improvement afforded over the prior art by this invention is graphically illustrated. Graph line 30 indicates the losses in db per wavelength of stripline for various frequencies where using metallization of a beryllium oxide substrate with a molybdenum-manganese metallization process by the techniques of the prior art. Graph line 31 illustrates losses for various frequencies for a similar stripline differing only in that the metallization structure and process of the invention was utilized in forming this assembly. It can be seen that a substantial improvement in efficiency is achieved with the technique and structure of this invention. As used in a microwave amplifier tube, the device of the invention led to an improvement of the tube efficiency by a factor of 1.3 as compared with the prior art.

The structure and technique of this invention thus provides a delay line (stripline) having a significant improvement in efficiency over comparable prior art devices.

While the invention has been described and illustrated in detail, it is to be clearly understood that this is intended by way of illustration and example only and is not to be taken by way of limitation, the spirit and scope of this invention being limited only by the terms of the following claims.

We claim:

1. A copper stripline assembly for use as a delay line in a microwave circuit comprising:

a substrate member of a high thermal conductivity ceramic, a thin layer of molybdenum deposited on each of two opposite faces of said member, a thin layer of copper deposited on each of said molybdenum layers, a copper stripline brazed to one of said copper layers, and a copper base plate brazed to the other of said copper layers.

2. The assembly of claim 1 wherein said ceramic member is selected from the group consisting of beryllium oxide, aluminum oxide, boron nitride and silicon oxide.

3. The device of claim 1 wherein said ceramic member is of beryllium oxide.

4. The device of claim 1 and additionally including a layer of gold deposited over each of said copper layers to form a copper-gold eutectic to facilitate brazing to said stripline and said support base.

5. The device of claim 1 and further including a layer of silver deposited over each of said copper layers to form a copper-silver eutectic to facilitate brazing to the stripline and said support base.

* * * * *